(12) United States Patent
Sjostrom

(10) Patent No.: US 11,230,195 B2
(45) Date of Patent: Jan. 25, 2022

(54) HYBRID ELECTRODYNAMIC LEVITATION SYSTEM

(71) Applicant: The Boeing Company, Chicago, IL (US)

(72) Inventor: Brett D. Sjostrom, Seattle, WA (US)

(73) Assignee: The Boeing Company, Chicago, IL (US)

( * ) Notice: Subject to any disclaimer, the term of this patent is extended or adjusted under 35 U.S.C. 154(b) by 626 days.

(21) Appl. No.: 16/055,729

(22) Filed: Aug. 6, 2018

(65) Prior Publication Data

US 2020/0039360 A1 Feb. 6, 2020

(51) Int. Cl.
*B60L 13/10* (2006.01)
*B60L 13/06* (2006.01)
*B61B 13/08* (2006.01)
*H02N 15/00* (2006.01)

(52) U.S. Cl.
CPC ............... *B60L 13/10* (2013.01); *B60L 13/06* (2013.01); *B61B 13/08* (2013.01); *H02N 15/00* (2013.01); *B60L 2200/26* (2013.01); *B60L 2240/12* (2013.01)

(58) Field of Classification Search
CPC .......... B60L 13/10; B60L 13/06; B60L 13/08; B60L 2200/26; B60L 2240/12; H02N 15/00
See application file for complete search history.

(56) References Cited

U.S. PATENT DOCUMENTS

| 4,858,511 A * | 8/1989 | Jasper, Jr. ............... | F41B 6/006 89/8 |
| 5,433,155 A * | 7/1995 | O'Neill .................. | B61B 13/08 104/138.1 |
| 6,758,146 B2 * | 7/2004 | Post ....................... | B60L 13/04 104/281 |
| 7,073,513 B2 * | 7/2006 | Cha ........................ | A61B 34/73 128/899 |
| 2020/0039360 A1 * | 2/2020 | Sjostrom ............... | E01B 25/305 |

FOREIGN PATENT DOCUMENTS

CN 208278048 12/2018

OTHER PUBLICATIONS

Sotelo, G.G., et al., "Tests on a Superconductor Linear Magnetic Bearing of a Full-Scale MagLev Vehicle", IEEE Transactions on Applied Superconductivity, Jun. 2011, pp. 1464-1468, vol. 21, No. 3.

(Continued)

*Primary Examiner* — Jason C Smith

(57) ABSTRACT

A hybrid electrodynamic levitation system that utilizes both superconducting and conductive tracks. The hybrid system reduces the overall drag induced upon the system and reduces the amount of power required to achieve operating speeds, while resolving the issue of requiring velocity relative to the track for levitation. The total initial and operating costs of the hybrid system can be lower than utilizing a superconductive or conductive track alone, while still enabling a fail-safe levitation system for high speed transportation.

20 Claims, 14 Drawing Sheets

(56) References Cited

OTHER PUBLICATIONS

Sotelo, G.G., et al., "Experimental and Theoretical Levitation Forces in a Superconducting Bearing for a Real-Scale Maglev System", IEEE Transactions on Applied Superconductivity, pp. 3532-3540, Oct. 2011, vol. 21, No. 5.

Post, R.F., et al., "The Inductrack Approach to Magnetic Levitation", MAGLEV 2000 The 16th International Conference on Magnetically Levitated Systems and Linear Drives, 2000, pp. 1-6.

Thornton, R.D., et al., "Efficient and Affordable Maglev Opportunities in the United States", Proceedings of the IEEE, Nov. 2009, pp. 1901-1921, vol. 97, No. 11.

Wang, S., et al., "The Man-Loading High-Temperature Superconducting Maglev Test Vehicle", IEEE Transactions on Applied Superconductivity, Jun. 2003, pp. 2134-2137, vol. 13, No. 2.

Hull, J., et al., "Magnetic Levitation", 2015, pp. 1-19, J. Webster (ed.), Wiley Encyclopedia of Electrical and Electronics Engineering.

Iniguez Jet al: "Laboratory scale prototype of a low-speed electrodynamic levitation system based on a Halbach magnet array", European Journal of Physics, Institute of Physics Publishing, Bristol, GB, vol. 30, No. 2, Mar. 1, 2009 (Mar. 1, 2009), pp. 367-379.

Jayawant B V et al: "Review Article; Electromagnetic suspension and levitation", Reports on Progress in Physics, Institute of Physics Publishing, Bristol, GB, vol. 44, No. 4, Apr. 1, 1981 (Apr. 1, 1981), pp. 411-477.

Extended European Search Report dated Jan. 16, 2020 for EP Application No. EP 19188709.

GCC Patent Office Examination Report dated Apr. 29, 2021 for Application No. GC 2019-38051.

European Examination Report dated Oct. 26, 2021 for European Patent Application No. 19188709.0.

Powell J.R., et al., "Magnetic suspension for levitated tracked vehicles", CRYOGENICS, Jun. 1971, pp. 192-204, vol. 11, No. 3, XP001451129.

\* cited by examiner

HYBRID ELECTRODYNAMIC LEVITATION SYSTEM

BACKGROUND

1. Field

The present disclosure relates to levitation system.

2. Description of the Related Art

Conventional passive electrodynamic suspension (EDS) levitation systems suffer from multiple drawbacks. FIG. 1 illustrates a conventional system utilizing permanent magnets for levitation of a vehicle on a conductive track and requiring motion of the vehicle relative to the conductive track to achieve a levitation force. This motion drives a requirement for the inclusion of wheels, or another means to prevent the levitation module from contacting the surface of the track when travelling at speeds lower than the velocity at which levitation occurs.

Moreover, due to the creation and dissipation of eddy currents within the conductive plate in the conductive track (originating from the changing magnetic field over the surface of the conductive plate) a magnetic drag force resists the forward motion of the vehicle. FIG. 2 illustrates the drag force increases and peaks at velocities around 10 mph, and then sharply decreases as the relative velocity increases. A large amount of power is required to overcome this drag force at relatively lower speeds (as compared to "cruise speeds" that are expected for use in high speed transport).

Systems that utilize tracks including a high temperature superconductive material are efficient, but extremely costly. While there is no magnetic drag associated with permanent magnets levitating over a superconductive track, there are small losses due to imperfections in the permanent magnetic field. The cost of the superconductive material for the entire length of the track, along with the cooling power associated with maintaining the entire track under a critical temperature required to achieve superconductivity, leads to high initial and operating costs that render conventional superconducting track technology unfeasible for longer routes.

What is needed then, is a magnetic levitation rail system that is more energy and cost efficient as compared to a magnetic levitation rail system using conductive plates or superconductors. The present disclosure satisfies this need.

SUMMARY

The present disclosure describes a hybrid rail for a railway track. The rail comprises a first portion connected to a second portion, wherein the first portion includes a superconductor and the second portion includes a conductor. A vehicle magnetically coupled to a track including the rail levitates relative to the first portion when a first magnetic field interacts with a second magnetic field. The first magnetic field is generated using the superconductor in a superconductive state and the second magnetic field generated from a magnet attached to the vehicle. The vehicle levitates relative to the second portion when the second magnetic field interacts with the conductor.

The rail can be embodied in many ways including, but not limited to, the following examples.

1. The rail wherein the first portion has a first tapered end and the second portion has a second tapered end, so that the first tapered end mates effectively with the second tapered end.

2. The rail of one or any combination of the previous examples includes the first portion comprising an evacuated double walled tube having a first wall and second wall. The first wall forms/encloses a first volume, and the first wall and the second wall form/enclose a second volume between the first and second wall. The superconductor is disposed in the first volume and the second volume comprises a vacuum.

3. In yet another example, the first portion of one or any combination of the previous examples includes the superconductor comprising a plurality of YBaCuO crystals.

4. In a further example, the conductor and the magnet of one or any combination of the previous examples are disposed so as to form an electromagnetic suspension system (EMS) so that the vehicle levitates L in response to a second lift force generated when the second magnetic field interacts with the conductor comprising a ferromagnetic material.

5. In yet another example, the conductor and the magnet of one or any combination of examples 1-3 are disposed so as to form an electrodynamic suspension system EDS so that the vehicle 1110 levitates in response to a second lift force F2 generated according to Lenz's law and a Lorentz force.

7. In a further example, the conductor of one or any combination of the previous examples comprises a solid conductive plate including slots and rungs.

8. In yet another example, the second portion of one or any combination of the previous examples comprises a laminate, the laminate including the conductor disposed as conductive material separated by an insulator.

9. In a further example, the magnet of one or any combination of the previous examples is disposed in a Halbach array.

10. In a yet another example the first portion of one or any combination of the previous examples has a length in a range of 100 feet-2000 feet.

11. In yet a further example, the first portion of one or any combination of the previous examples has a length sufficiently long for the vehicle to reach a speed, when entering the second portion from the first portion, such that the vehicle experiences a lift to drag ratio exceeding the maximal lift to drag ratio of the second portion.

12. In yet another example, the length in example 11 is such that the vehicle accelerates with a maximum acceleration of 1 g from an initial speed of 0 mph at one end of the first portion to a speed of at least 100 miles per hour at the other end of the first portion connected to the second portion.

13. A rail system including the rail of one or any combination of the previous example, wherein the first portion comprises less than 0.1% of an entire length of track in the rail system.

14. The rail system of example 13, further comprising a computer configured to control a speed of the vehicle on the rail system, wherein the speed when entering the second portion from the first portion is such that the vehicle experiences a lift to drag ratio of at least 100 or exceeding the maximal lift to drag ratio of the second portion 304.

15. The rail of one or any combination of the previous examples, wherein the first portion includes a first section and a second section and the second portion between the first section and the second section.

16. The rail of one or any combination of the previous examples, wherein the vehicle comprises a passenger train.

The present disclosure further describes a method of operating a vehicle, comprising operating the vehicle on a track including a rail, the rail including a first portion connected to a second portion, and the first portion including a superconductor and the second portion including a conductor. The vehicle magnetically coupled to the track:

(1) levitates relative to the first portion in response to a first lift force generated when a first magnetic field generated using the superconductor in a superconductive state interacts with a second magnetic field generated from a magnet attached to the vehicle, and (2) levitates relative to the second portion in response to a second lift force generated when the second magnetic field interacts with the conductor.

The present disclosure further describes a vehicle, comprising a magnet attached to a passenger cabin, the magnet generating a magnetic field interacting with a rail including a first portion connected to a second portion, the first portion including a superconductor and the second portion including a conductor; and a computer system connected to the vehicle controlling a speed of the vehicle. The vehicle:

(1) levitates relative to the first portion in response to a first lift force generated when a first magnetic field generated using the superconductor in a superconductive state interacts with a second magnetic field generated from a magnet attached to the vehicle, (2) levitates relative to the second portion in response to a second lift force generated when the second magnetic field interacts with the conductor, and (3) has a speed entering the second portion from the first portion such that lift to drag ratio associated with the vehicle is at its maximum value for the second portion of the track.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Technical Description

Figure 1:
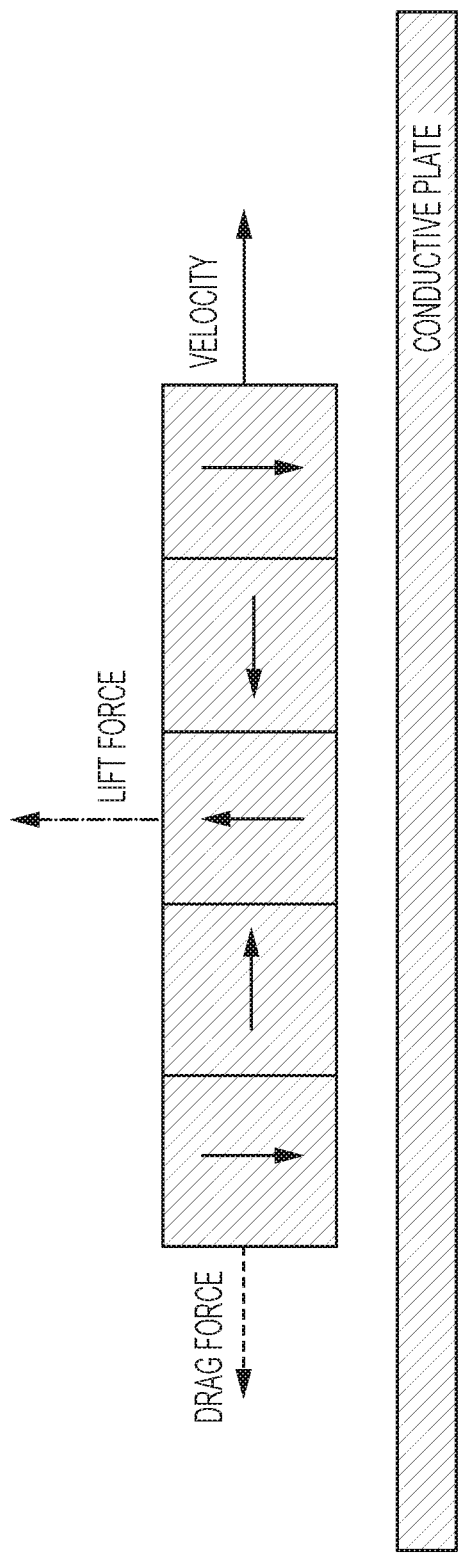
FIG. 1 illustrates a typical EDS levitation system.
Figure 2:
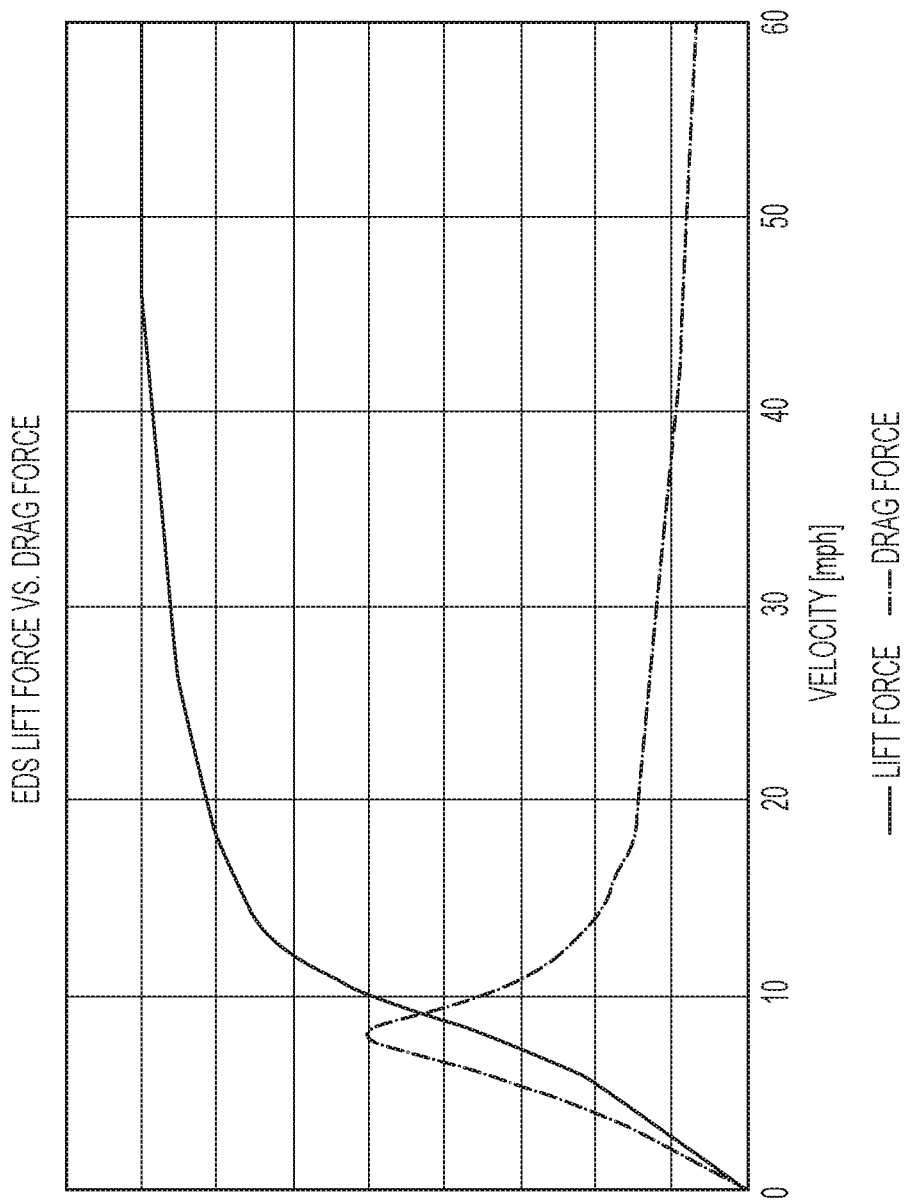
FIG. 2 illustrates typical lift and drag forces found in passive EDS systems.
Figure 3A:
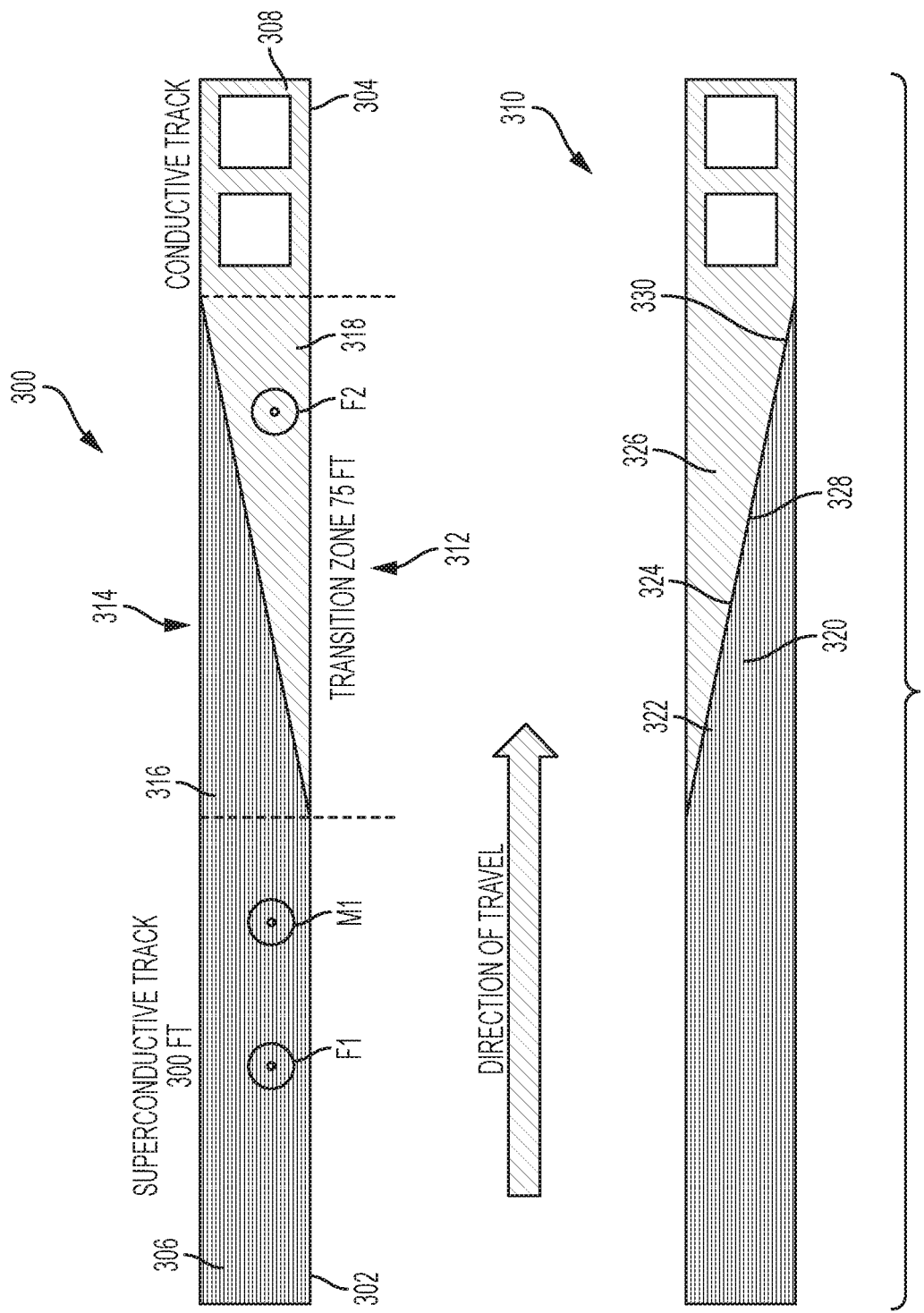
FIG. 3A illustrates a hybrid electrodynamic levitation system including a transition region between the superconductive track and the conductive track, according to one or more examples.

Hybrid Track Including a Superconductive Track Region and a Conductive Track Region FIG. 3A illustrates a rail 300 including a first portion 302 connected to a second portion 304, the first portion 302 including a superconductor 306 and the second portion 304 including a conductor 308. A vehicle magnetically coupled to a track 310 including the rail 300 levitates relative to the first portion in response to a first lift force F1 generated when a first magnetic field M1 (generated using the superconductor in a superconductive state) interacts with a second magnetic field M2 (generated from a magnet attached to the vehicle). The vehicle levitates relative to the second portion in response to a second lift force F2 generated when the second magnetic field M2 interacts with the conductor in the second portion.

Also shown is a transition zone 312 between first portion and the second portion. In the transition zone 312, the first portion 302 connects to an outside 314 of the second portion 304 so as to increase lift stability on the outside of the track. The amount of the first portion in the transition zone is reduced moving towards the second portion. In the example transition zone illustrated in FIG. 3A, the first portion has a first tapered end 316, the second portion has a second tapered end 318, and the first tapered end mates with/is physically attached to the second tapered end 318. More specifically, as viewed from the top, the first tapered end comprises a first triangular cross-section 320 having a first hypotenuse 322 in a plane comprising a first surface 324, the second tapered end comprises a second triangular cross section 326 having a second hypotenuse 328 in a plane comprising a second surface 330, and the first surface 324 mates or is attached to the second surface 330. In one or more examples, the transition zone has a length of 50-200 feet (e.g., 75 feet).

Figure 3B:
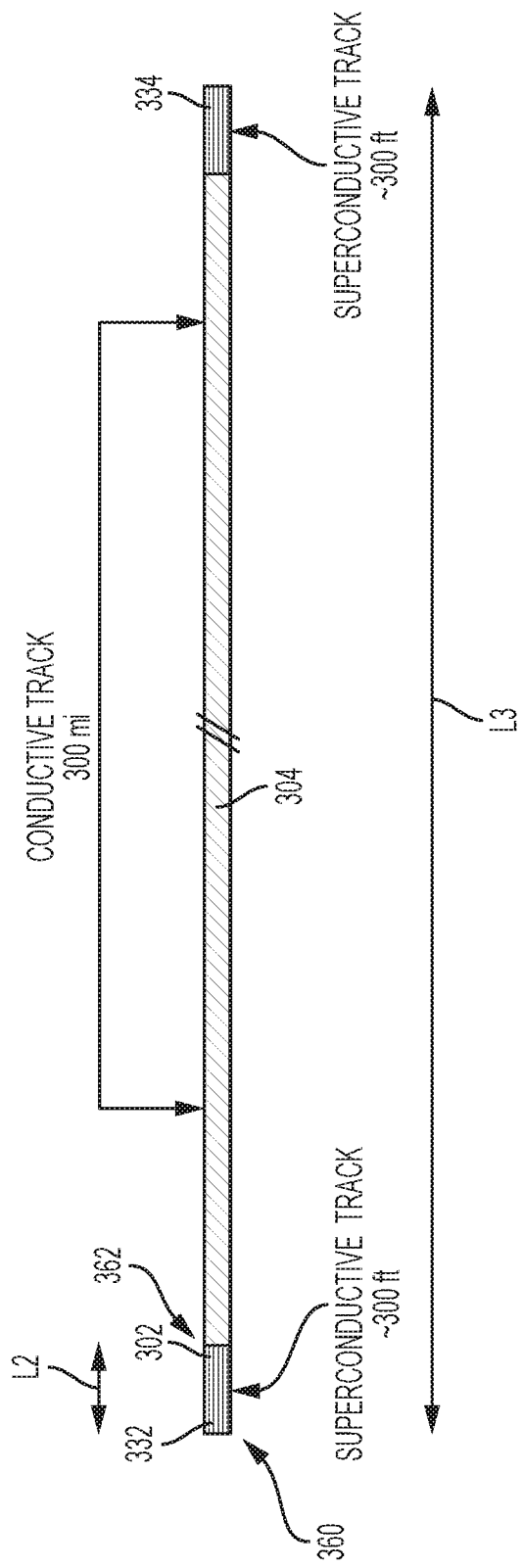
FIG. 3B illustrates a hybrid electrodynamic levitation system according to one or more embodiments, illustrating an exemplary length of superconductive track in comparison to the length of conductive track (conductive track much longer than superconductive track, not shown to scale). In this example, the conductive track has length of 300 miles (mi) and the portions of superconductive track each have a length of 300 feet.

FIG. 3B illustrates a rail system 300b comprising a track including the conductive portion (second portion 304) in between or in the middle of two superconductive portions (first section 332 and second section 334). In other words, the first portion 302 comprises the first section 332 and second section 334 and the second portion 304 is between (or in the middle of) the first section 332 and second section 334.

The lengths of the superconductive tracks (first and second sections of the track) are determined by how long it takes the vehicle traveling on the superconductive track to reach speeds higher than the peak drag value. However, in typical examples, the first portion comprising the superconductive track is shorter than the second portion comprising the conductive track. The superconductive track (first and second sections) are acceleration zones at the beginning and end of the track that (1) allow for levitation of the vehicle with no relative velocity of the vehicle relative to the track, thereby eliminating the need for wheels or additional means of rolling, and (2) increase efficiency of acceleration by eliminating magnetic drag force. In one example, assuming a maximum acceleration value of 1 g to ensure passenger comfort, a speed exceeding 100 mph is achieved after travelling approximately 300 or 400 feet on the first portion including superconductive track. This high speed exceeding 100 mph ensures an adequately high lift to drag ratio when entering into the conductive track (middle or second portion) from the first portion comprising superconductive track.

In one example that seeks to minimize costs, the lengths of the first and second sections including the superconductive track are a minute percentage (<0.1%) of the entire length of the track so as to minimize cost and energy consumption (e.g., due to cooling requirements for the superconductive track). In one or more examples, the conductive track (second portion) has a length of at least 300 miles.

Superconductive Track Example

In one or more examples, the first portion comprising the superconductive region of track requires cooling e.g., using liquid nitrogen or a refrigeration cycle. For example, liquid nitrogen with a boiling point of 77 K can be used to cool the superconductor (e.g., high temperature superconductive material, e.g., YBaCuO superconductors that maintain superconductivity at temperatures lower than 92 K). Refueling of the liquid nitrogen or additional power can be used to keep the superconductive track beneath the critical temperature required to maintain the superconductive state of the superconductor.

Figure 4:
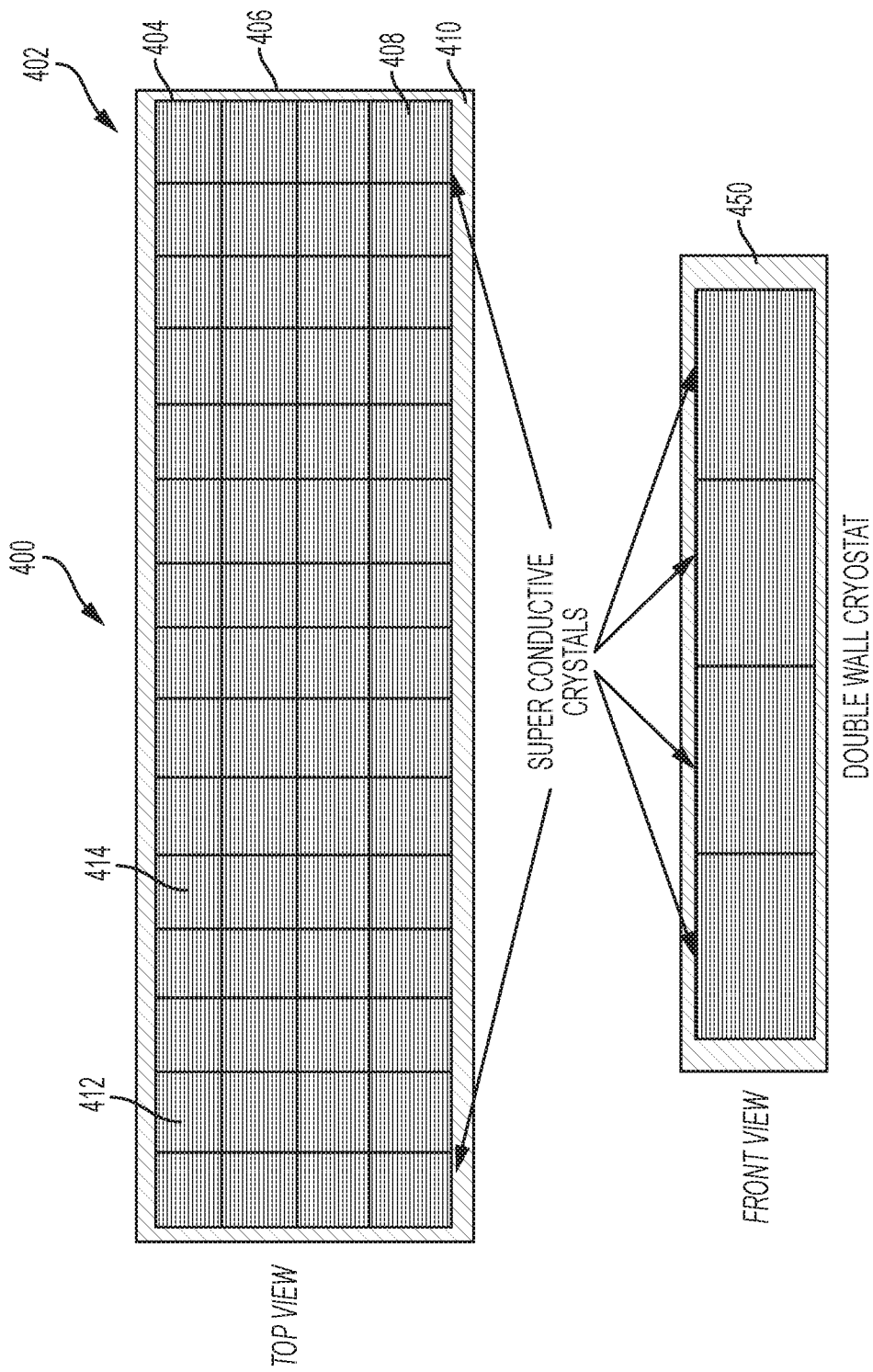
FIG. 4 illustrates an exemplary housing for superconductive material in the superconductive region of the hybrid system.

FIG. 4 illustrates the first portion 302 of track includes a cryostat/cryostat chamber 400 comprising an evacuated double walled tube 402 having a first wall 404 and second wall 406. The first wall forms or encloses a first volume 408, and a second volume 410 is formed or enclosed between the first wall and the second wall. In one or more examples, the cryostat and walls 404, 406 are fabricated from stainless steel.

The superconductor comprising superconductive material 412 is disposed or contained in the first volume. FIG. 4 further illustrates the cryostat housing superconductive material including superconductive crystals 414 disposed in a grid like fashion. The sizing of the superconductive crystals is based on the optimal grain size of the superconductive material. In one example, the crystals are YBaCuO crystals that are approximately 2.5"×1.25"×0.5".

The second volume between the first and second walls is evacuated so as to form vacuum 450 insulation which eliminates nearly all heat transfer. The additional low pressure environment in the second volume in the tube also results in decreased heat convection from the outside environment, thereby aiding in keeping the track at low temperatures. The cryostat can be actively cooled using refrigeration technology (the expected power consumption for actively cooling is on the order of 1-5 kilowatts for a total of 1200 ft of cooled track, corresponding to between 0.5-5 Watts per foot) or refilled with liquid nitrogen as needed. In one example, the first volume also contains the coolant (e.g., liquid nitrogen or other refrigerant) used to cool the superconductive material into a superconducting state. A valve can be connected to the first volume and configured to receive and transfer the coolant into the first or second volume.

The superconductive track width can be scaled with the size of the levitated mass. A track designed to be approximately 12 inches in width can levitate a 40,000 pound (lb) vehicle (although track width doesn't impact the weight of vehicle that can be levitated, since the longer the vehicle, the heavier the vehicle that can be levitated.

Conductive Track Region

The main portion (second portion 304) of the track is comprised of a low cost conductive track that is optimized for a high lift to drag ratio. The track may be slotted or laminated to increase the inductance and therefore the lift to drag ratio, for example.

Figure 5:
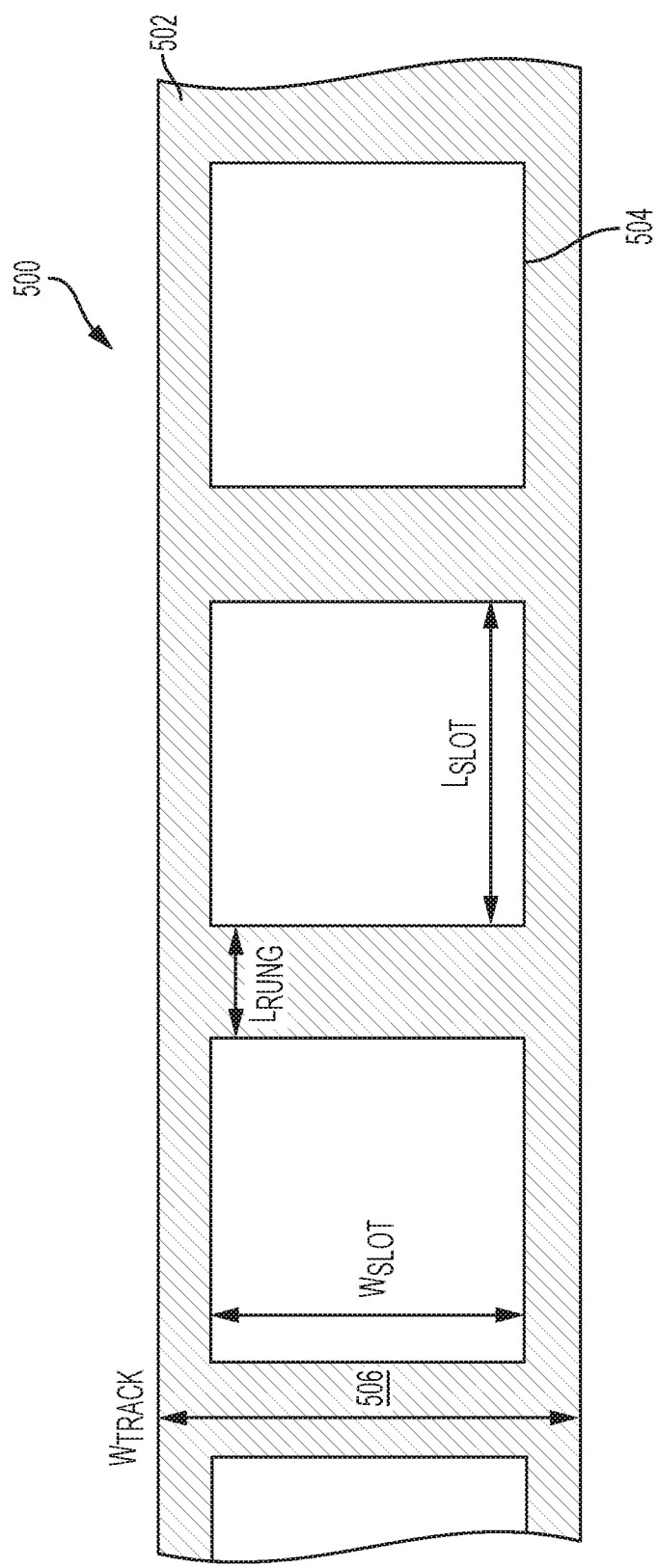
FIG. 5 illustrates an exemplary conductive track in the hybrid system, wherein the conductive track includes a conductive slotted track and optimization of the track parameters depends upon magnet geometry, vehicle speed, and desired lifting force.

FIG. 5 illustrates a slotted track 500 embodiment comprised of a solid conductive plate 502 with a machined out geometry. The geometry of the slots 504 and rungs 506 that comprise the track can be optimized in relation to the magnet geometry, vehicle speed, and desired lifting force. Example dimensions include, but are not limited to, a slot width $W_{SLOT}$ and a slot length $L_{SLOT}$ in a range of 1-2 feet, a rung length (Lrung) in a range of 0.2-0.75 feet, and a track width $W_{track}$ in a range of 0.5-3 feet. Example materials for the conductive plate include, but are not limited to, aluminum. Example lift to drag ratios of at least 50 have been measured using this track configuration.

Figure 6:
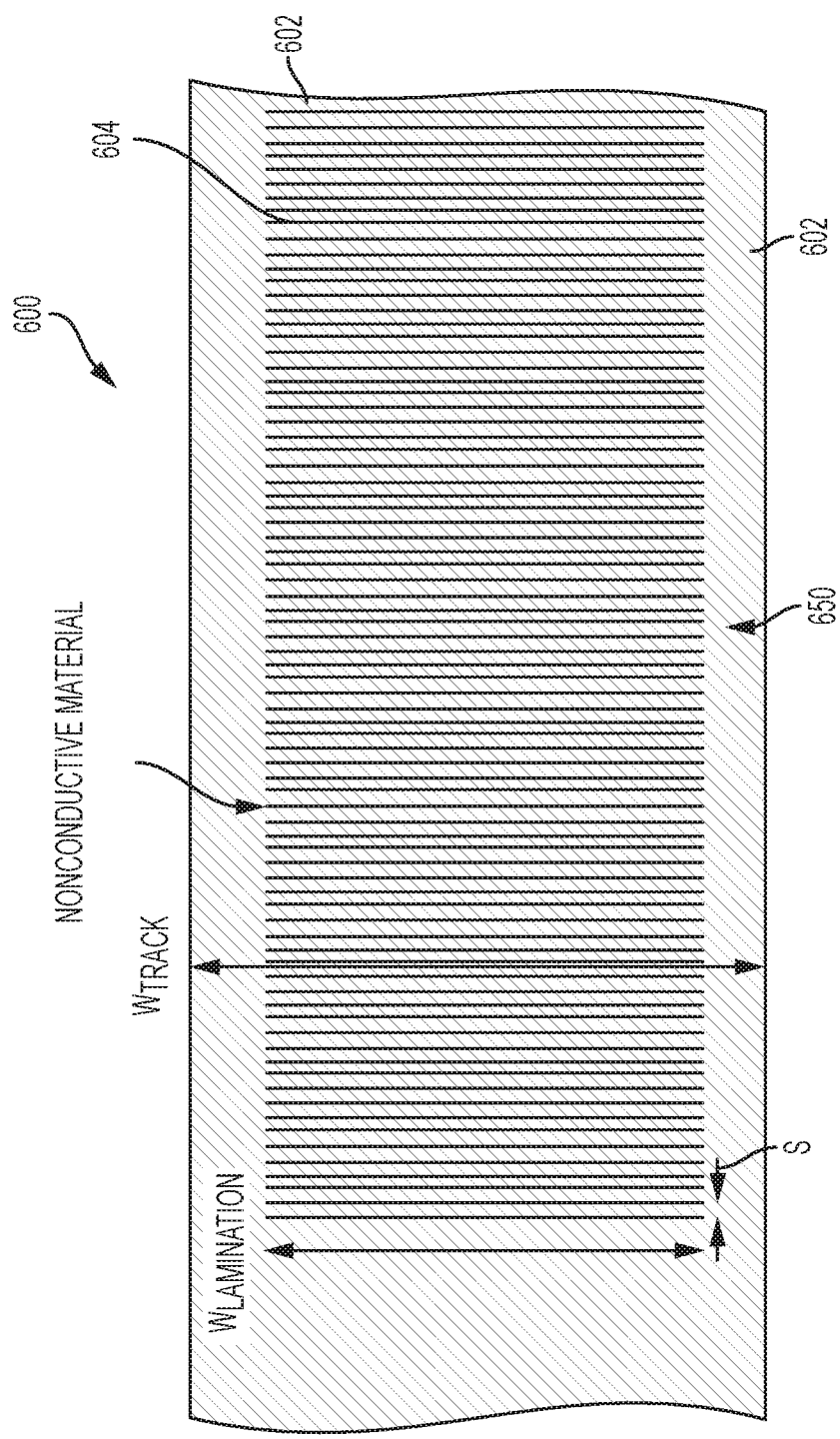
FIG. 6 illustrates another exemplary conductive track in the hybrid system, wherein the conductive track comprises a laminate.

FIG. 6 illustrates a laminated track 600 example comprised of conductive material 602 (e.g., aluminum) separated every few mm (e.g., spacing in a range of 1-10 mm) by a nonconductive material or insulator 604 such as, but not limited to, thin plastic sheets or anodized aluminum. Example dimensions for the laminated track include, but are not limited to, a track width Wtrack in a range of 0.5-2 feet (e.g., 1 foot). Theoretical lift to drag ratios for these dimensions exceed 150 at speeds greater than 100 mph. The spacing S between the conductive material can be set so as to localize the eddy currents.

Implementation of the conductive track is extremely cost efficient in comparison to the use of superconductive track. The use of a conductive track in the high speed portions of the track leads to a smaller amount of losses due to magnetic drag, but also provides a fail-safe mode of levitation. If power to the track or vehicle is lost, the vehicle will continue stable levitation until it reaches speeds of around 10 mph.

Example Vehicle

Figure 7:
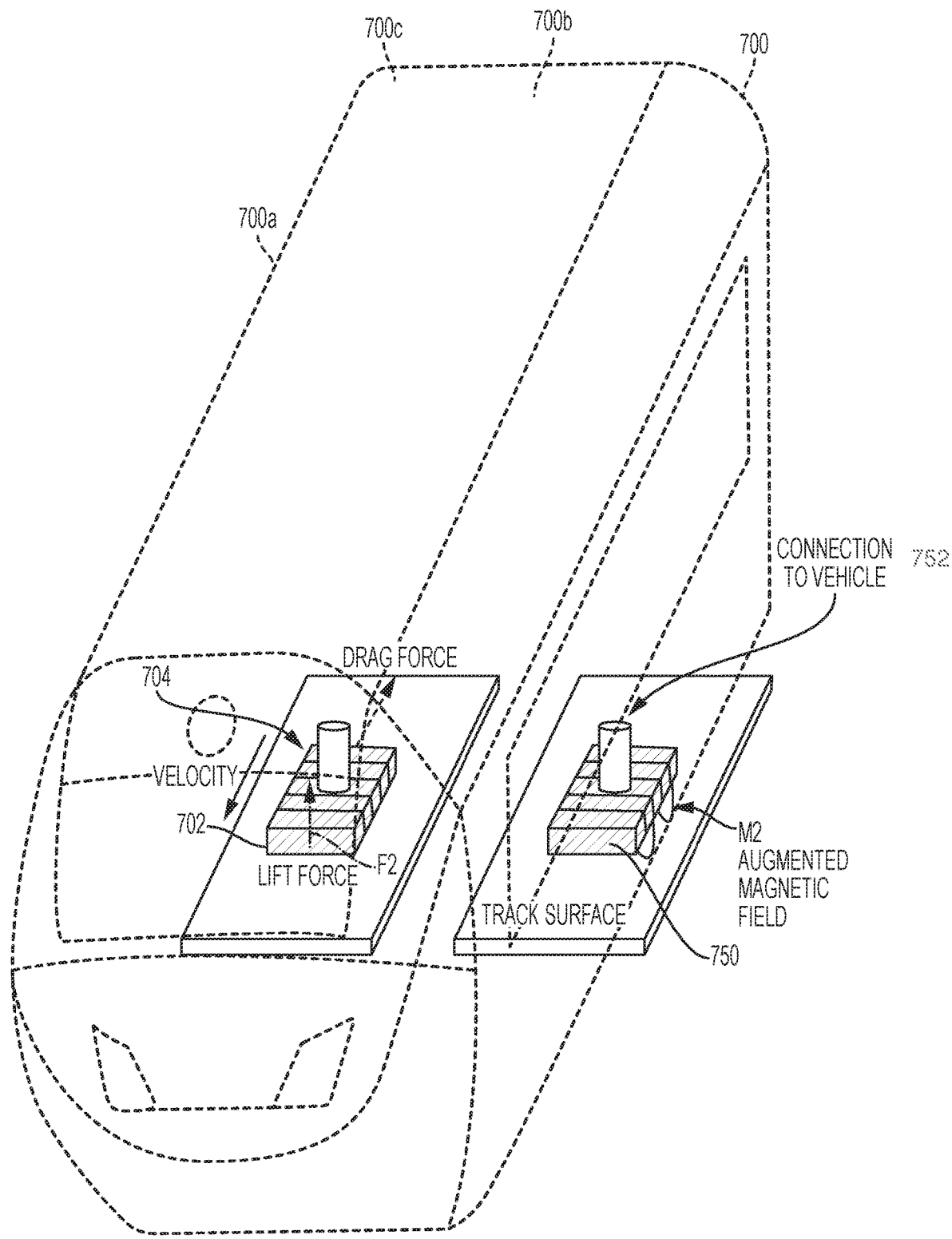
FIG. 7 illustrates Halbach arrays arranged on the base of a vehicle on levitation modules, wherein the Halbach arrays interact with the hybrid track or hybrid track surfaces so as to levitate the vehicle.
Figure 8:
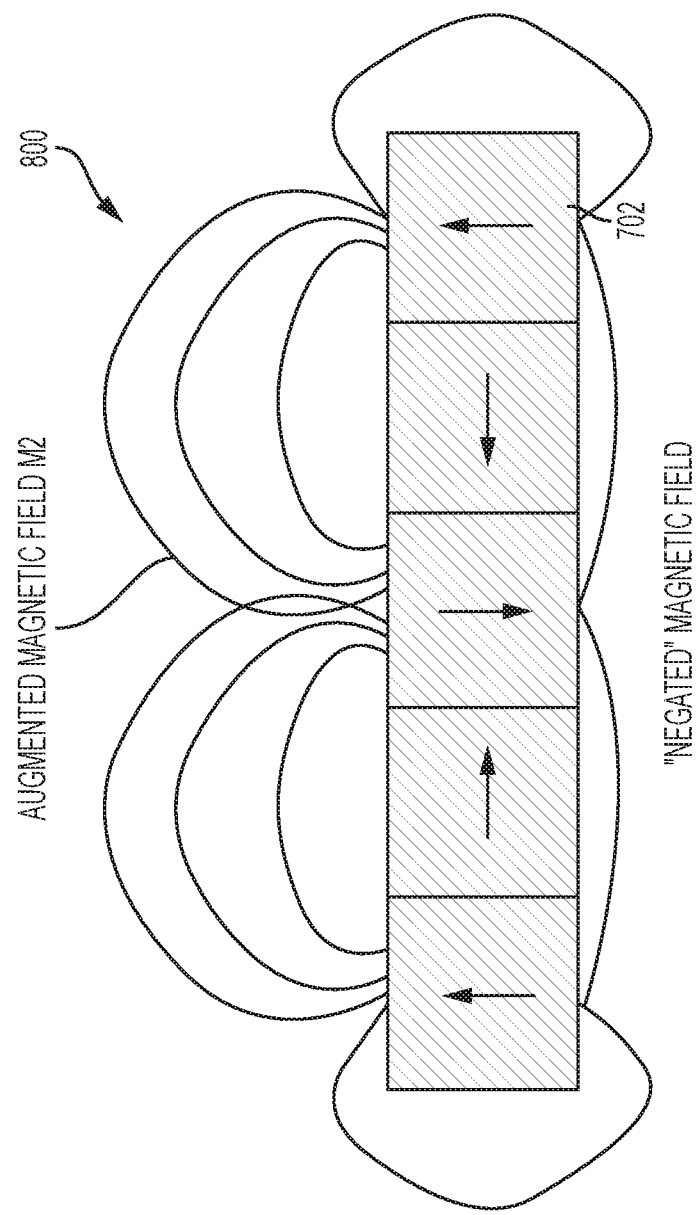
FIG. 8 illustrates an example orientation of the permanent magnets in a Halbach array used on a vehicle traveling on the hybrid levitation system.

FIG. 7 illustrates a vehicle 700 or passenger train 700*a* including the vehicle (e.g., passenger cabin 700*b* or train engine 700*c*) comprising magnetic modules 750 including magnets 702 configured to generate a magnetic field M2 that interacts with the track so as to levitate the vehicle above the track. In the example of FIG. 7, the magnetic field M2 that allows for magnetic levitation is generated by an array of permanent magnets 702 on the vehicle that are oriented in a "Halbach array". The magnetic modules 750 including the one or more magnets 702 are attached (connection 752) to the vehicle 700. FIG. 8 illustrates the Halbach array 800 is a certain configuration of permanent magnets that augments the magnetic flux density on one side of the array, and nearly negates it on the other. The Halbach array is oriented on the vehicle 700 such that the augmented magnetic field is interacting with the surface of the track 310. In one or more examples, the magnets disposed in the Halbach array comprise an alloy of neodymium, iron, and boron.

Figure 9:
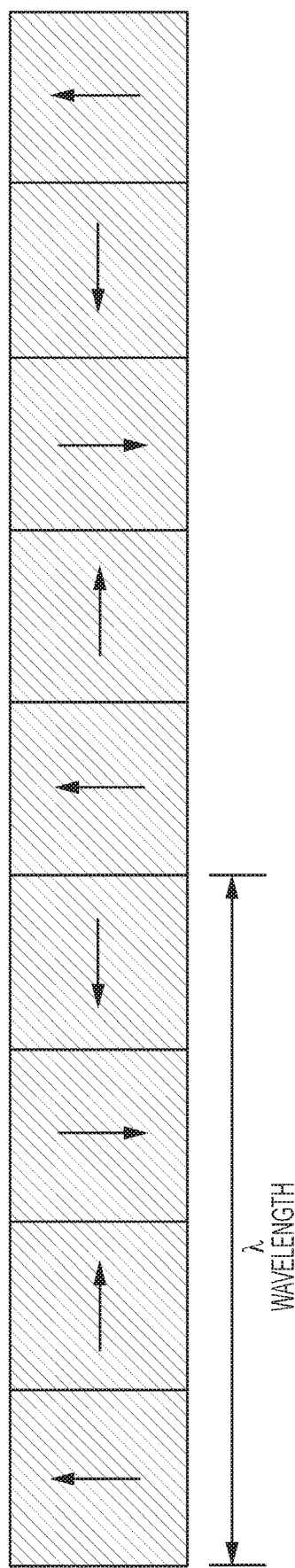
FIG. 9 is an exemplary visual depiction of the wavelength of a Halbach array.
Figure 10:
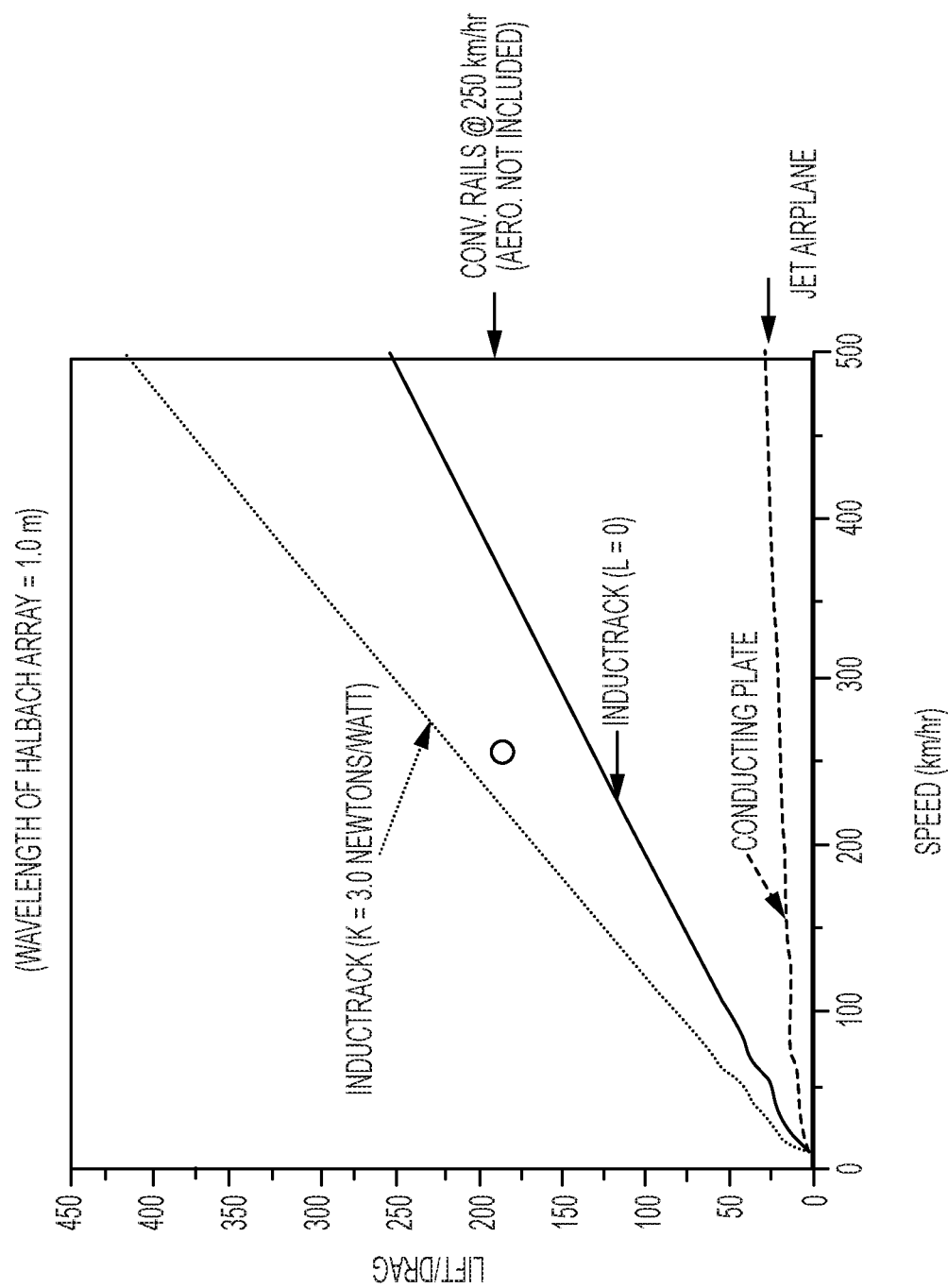
FIG. 10 illustrates lift to drag ratio as a function of vehicle speed, for different types of conductive track coupled to a vehicle including a Halbach array, reproduced from "the inductrack approach to magnetic levitation' by Post et. al., https://e-reports-ext.llnl.gov/pdf/237852.pdf.

The Halbach array 800 can be optimized with longer wavelengths to increase the lift to drag ratio of the levitation system (wherein wavelength defined as the length between repeating sections of a Halbach array, as shown in FIG. 9). FIG. 10 illustrates lift to drag ratio as a function of wavelength of the Halbach array and speed, for different types of conductive track.

The implementation of the Halbach array allows for a higher levitated mass per magnet mass, as it increases the efficiency (magnetic flux per unit mass) of the permanent magnets. The orientation and positioning of the magnets can be optimized for use with the conductive track and will still perform adequately during their interaction with the superconductor in the superconductive track (first portion).

Example Rail Systems: Vacuum Tube Train (Vactrain)

Figure 11B:
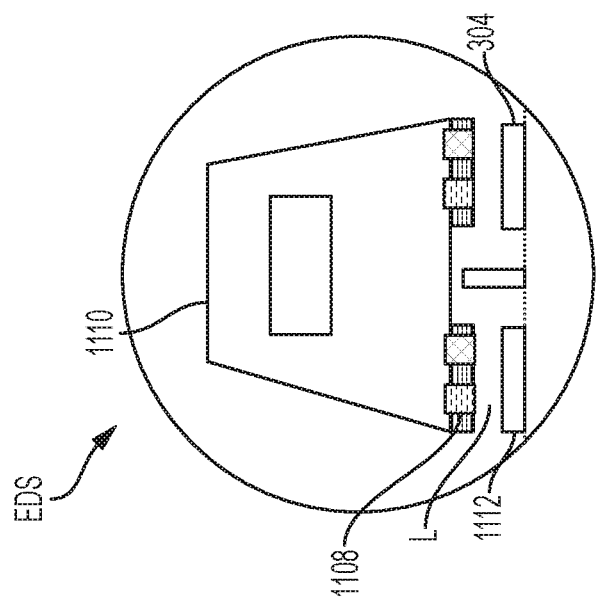
FIG. 11B illustrates an exemplary electrodynamic suspension system that can be used in the conductive section of the hybrid levitation system.
Figure 11A:
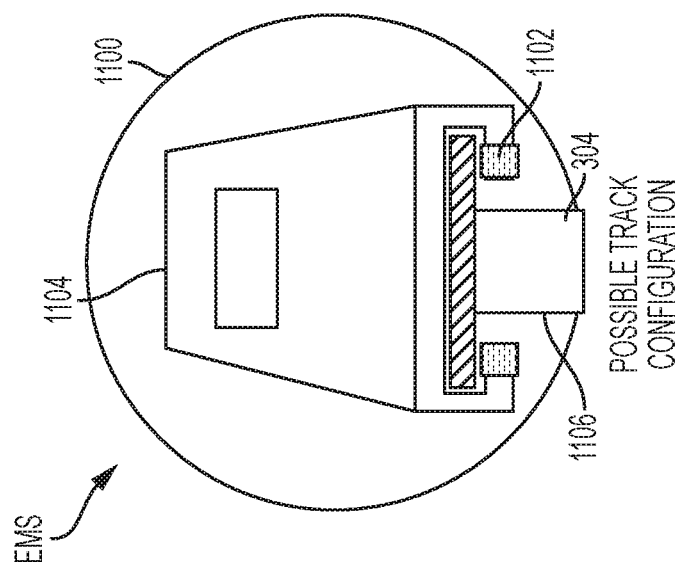
FIG. 11A illustrates an exemplary electromagnetic suspension system that can be used in the conductive section of the hybrid levitation system.

FIGS. 11A-11C illustrate the conductive region or portion (second portion 304) of the hybrid track 310 in a vacuum tunnel 1100 (i.e., the vehicle comprises a passenger train travelling on a track 310 in an evacuated tunnel to further reduce drag).

FIG. 11A illustrates a rail (300) wherein the conductor (308) and the magnet (702) are disposed so as to form an electromagnetic suspension system (EMS) so that the vehicle (1104) levitates (L) when the second magnetic field (M2) interacts with the conductor (308) comprising a ferromagnetic material (1150). In one or more examples, the magnets include electromagnets 1102 attached to the vehicle 1104, the electromagnets interfacing with the conductive track (second portion 304) comprising a (e.g., laminated ferromagnetic) track 1106. In one or more examples, the electromagnets are actively controlled to provide a gap between the track 1106 and the magnets ranging from 1-4 cm. Feedback from proximity sensors feeds into electromagnets to maintain a constant gap. The electromagnets can be powered with a superconducting coil (reducing the energy requirement) and additional coils can be positioned to improve stability. Since the electromagnetic suspension system utilizes an attractive magnetic force between the conductive track 1106 and the electromagnets 1102, the track 1106 must be above the electromagnets. The attractive magnetic force between the electromagnets and the ferromagnetic track decays exponentially with increasing distance from the steel track. Although the example of FIG. 11A illustrates the conductive track including a laminated ferromagnetic track, other ferromagnetic tracks can be used. The lift to drag ratio can range from 20 (for a solid ferromagnetic track) to (theoretically 100 or more using a laminated track).

FIG. 11B illustrates a rail (300) wherein the conductor (308) and the magnet (702) are disposed so as to form an electrodynamic suspension system (EDS) so that the vehicle (1110) levitates in response to a second lift force F2 generated according to Lenz's law and a Lorentz force. In one or more examples, the magnets 1108 on the vehicle 1110 interface with the conductive track 1112 (second portion 304). In an example passive system, permanent magnets are mounted on the vehicle in a single sided Halbach array with the conductive track 1112 including a ladder or Inductrack track surface as illustrated in FIG. 5 or FIG. 6 for example. In another example passive system, permanent magnets are mounted on the vehicle in a double Halbach array (Null Flux) with the conductive track including a ladder or Inductrack track surface. In yet another example passive system, permanent magnets are mounted on the vehicle in a single sided Halbach array with the conductive track comprising loops (Null Flux). In one example, the rail comprises 6061 aluminum (exampled dimensions include, but are not limited to, a track having a width of 12 feet and a thickness of 0.25 feet).

Without being bound by a particular scientific theory, the electrodynamic suspension system operates using Lenz's Law and the Lorentz Force, wherein a change in magnetic field in the conductive surface of the conductive track 1112 (caused by motion of magnets in the vehicle over the conductive track) generates eddy currents. The change in magnetic field in turn creates a magnetic field that opposes the change in magnetic field induced upon it. This causes opposing forces resulting in levitation of the vehicle.

In one or more examples, the EDS system exhibits a lift to drag ratio of 20, the gap between the vehicle and the conductive track is approximately 10 mm and the ratio of the mass of the vehicle to the magnet mass is 50:1.

Process Steps

Figure 12:
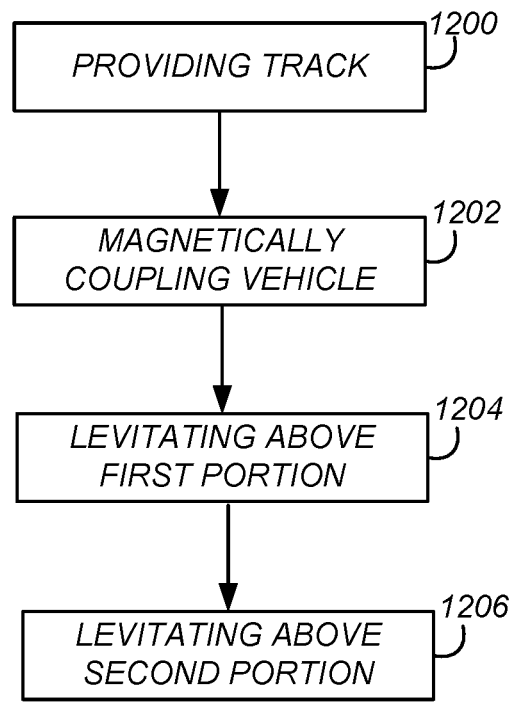
FIG. 12 is a flowchart illustrating a method for making and operating a rail system according to one or more examples.

FIG. 12 is a flowchart illustrating a method of making and/or operating a rail system.

Block 1200 represents obtaining or providing (e.g., assembling or laying) a track comprising a rail, the rail including first portion connected to a second portion, the first portion including a superconductor and the second portion including a conductor. In one or more examples, the first portion (302) has a first tapered end (316) and the second portion (304) has a second tapered end (318), and the first tapered end (316) mates with the second tapered end (318). In this way, the first portion 302 connects to an outside 314 of the second portion 304 so as to increase lift stability on the outside of the track.

Examples of superconductor include, but are not limited to, YBaCuO superconductive material or other high-temperature superconductive materials.

In one or more examples, the conductor 308 comprises a solid conductive plate 502 including slots 504 and rungs 506.

In one or more examples, the second portion 304 comprises a laminate 650, the laminate 650 including the conductor 308 disposed as conductive material 602 separated by an insulator 604.

Example lengths L2 for the first portion include, but are not limited to, a length L2 in a range of 100 feet-2000 feet or a length L2 sufficiently long for the vehicle 700 to reach a speed, when entering the second portion 304 from the first portion 302, such that the vehicle 700 experiences a lift to drag ratio exceeding the maximal lift to drag ratio of the second portion (e.g., more than 100). In one or more examples, the length L2 is such that the vehicle 700 accelerates with a maximum acceleration of 1 g from an initial speed or velocity of 0 mph at one end 360 of the first portion 302 to a speed/velocity of at least 100 miles per hour at the other end 362 of the first portion 302 connected to the second portion 304. In one or more further examples, the first portion 302 comprises less than 0.1% of an entire length L3 of track 310 in the rail system 300*b*.

Block 1202 represents optionally magnetically coupling a vehicle 700 to the track 310, wherein the vehicle comprises 700 a magnet 702 attached to the vehicle 700. In one or more examples, the magnet 702 comprises a rare earth permanent magnet (e.g., a magnet comprising an alloy of neodymium, iron, and boron). The magnet 702 generates a magnetic field M2 interacting with the rail 300 (first portion 302 or second portion 304).

Block 1204 represents optionally allowing the vehicle 700 to levitate L relative to the first portion 302 in response to a first lift force F1 generated when a first magnetic field M1 (generated using the superconductor 306 in a superconductive state) interacts with a second magnetic field M2 generated from the magnet 702 attached to the vehicle 700.

A propulsion system connected to the vehicle 700 controls a speed/velocity of the vehicle 700 guided along the track 310 by the rails 300.

Block 1206 represents optionally allowing the vehicle 700 to levitate L relative to the second portion 304 in response to a second lift force F2 generated when the second magnetic M2 field interacts with the conductor 308.

A computer system 1300 connected to the vehicle 700 controls a speed of the vehicle 700 so that the vehicle 700 has a speed or velocity (entering the second portion 304 from the first portion 302) such that lift to drag ratio associated with the vehicle 700 is at its maximum value for the second portion 304.

Processing Environment

Figure 13:
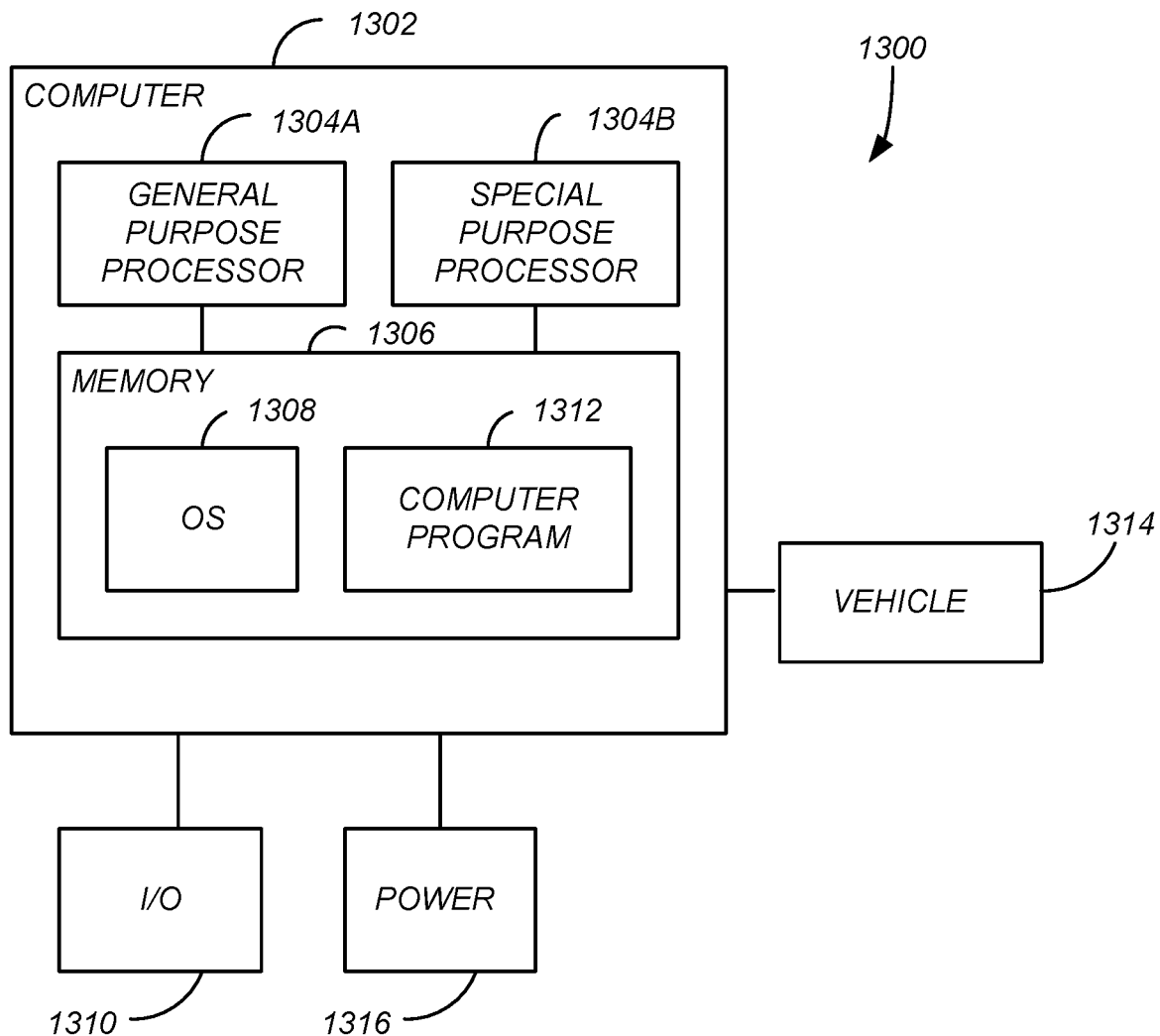
FIG. 13 illustrates an exemplary hardware environment for controlling speed of a vehicle coupled to the hybrid track.

FIG. 13 illustrates an exemplary system 1300 used to implement processing elements needed to control the speed of the vehicle 1314, 700 so that the lift to drag ratio entering the conductive portion of the track is sufficiently high (e.g., greater than 100).

The computer 1302 comprises a processor 1304 (general purpose processor 1304A and special purpose processor 1304B) and a memory, such as random access memory (RAM) 1306. Generally, the computer 1302 operates under control of an operating system 1308 stored in the memory 1306, and interfaces with the user/other computers to accept inputs and commands (e.g., analog or digital signals from the crew or automatic ice detector) and to present results through an input/output (I/O) module 1310. The computer program application 1312 accesses and manipulates data stored in the memory 1306 of the computer 1302. The operating system 1308 and the computer program 1312 are comprised of instructions which, when read and executed by the computer 1302, cause the computer 1302 to perform the operations and/or methods herein described. In one embodiment, instructions implementing the operating system 1308 and the computer program 1312 are tangibly embodied in the memory 1306, thereby making one or more computer program products or articles of manufacture capable of controlling the speed of the vehicle on the hybrid track as described herein. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present disclosure. For example, those skilled in the art will recognize that any combination of the above components, or any number of different components, peripherals, and other devices, may be used.

Advantages and Improvements

The implementation of a hybrid superconductive/conductive track according one or more examples described herein solves the following problems:

The requirement for wheels or additional means to prevent contact of levitation modules with the track and which slows the vehicle down. Vehicles described herein that do not require wheels assist with the acceleration of the vehicle.

Decreased efficiency due to low lift to drag ratio. Embodiments of the rail system described herein aids acceleration of vehicles (e.g., in evacuated tubes) by ensuring that the vehicle enters the conductive region with an adequately high lift to drag ratio. Embodiments of the rail system described herein increase the efficiency of acceleration to cruise speeds by at least 50%.

High costs. Embodiments of the rail system described herein reduce both overall initial and operating costs.

Levitation failure. Embodiments of the hybrid rail system described herein enable fail-safe levitation in high-speed regions.

CONCLUSION

This concludes the description of the preferred embodiments of the present disclosure. The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A rail (300), comprising:
a first portion (302) connected to a second portion (304), the first portion (302) including a superconductor (306) and the second portion (304) including a conductor, wherein a vehicle magnetically coupled to a track including the rail:
levitates relative to the first portion when a first magnetic field interacts with a second magnetic field, the first magnetic field generated using the superconductor in a superconductive state and the second magnetic field generated from a magnet attached to the vehicle, and
levitates relative to the second portion when the second magnetic field interacts with the conductor in an electrodynamic suspension system comprising the magnet and the conductor, wherein the vehicle levitates in response to a lift force and a experiences a resisting force resisting forward motion of the vehicle, the lift force and the resisting force resulting from a change in a magnetic field caused by motion of the magnet over the conductor.

2. The rail of claim 1, wherein:
the first portion has a first tapered end and the second portion has a second tapered end, and
the first tapered end mates with the second tapered end.

3. The rail of claim 2, wherein:
the first portion comprises an evacuated double walled tube having a first wall and a second wall, the first wall forming a first volume, the first wall and the second wall forming a second volume between the first wall and the second wall;
the superconductor is disposed in the first volume; and
the second volume comprises a vacuum.

4. The rail of claim 3, wherein the superconductor comprises a plurality of YBaCuO crystals.

5. The rail of claim 1, wherein the conductor and the magnet are disposed so as to form an electromagnetic suspension system so that the vehicle levitates in response to a second lift force F2 generated when the second magnetic field interacts with the conductor comprising a ferromagnetic material.

6. The rail of claim 1, wherein the vehicle levitates in response to the lift force generated according to Lenz's law and a Lorentz force.

7. The rail of claim 1, wherein the conductor comprises a solid conductive plate including slots and rungs.

8. The rail of claim 1, wherein the second portion comprises a laminate, the laminate including the conductor disposed as conductive material separated by an insulator.

9. The rail of claim 1, wherein the magnet is disposed in a Halbach array.

10. The rail of claim 1, wherein the first portion has a length in a range of 100 feet-2000 feet.

11. The rail of claim 1, wherein the first portion has a length sufficiently long for the vehicle to reach a speed, when entering the second portion from the first portion, such that the vehicle experiences a lift to drag ratio exceeding a maximal lift to drag ratio of the second portion.

12. The rail of claim 11, wherein the length is such that the vehicle accelerates with a maximum acceleration of 1 g from an initial speed of 0 mph at one end of the first portion to a speed of at least 100 miles per hour at the other end of the first portion connected to the second portion.

13. A rail system including the rail of claim 1, wherein the first portion comprises less than 0.1% of an entire length of track in the rail system.

14. The rail system of claim 13, further comprising a computer configured to control a speed of the vehicle on the rail system, wherein the speed when entering the second portion from the first portion is such that the vehicle experiences a lift to drag ratio of at least 100 or exceeding the maximal lift to drag ratio of the second portion.

15. The rail of claim 1, wherein the first portion includes a first section and a second section and the second portion between the first section and the second section.

16. The rail of claim 1, wherein the vehicle is in a passenger train.

17. A method of operating a vehicle, comprising:
   operating the vehicle on a track including a rail, the rail including a first portion connected to a second portion, the first portion including a superconductor and the second portion including a conductor, wherein the vehicle magnetically coupled to the track:
   levitates relative to the first portion in response to a first lift force generated when a first magnetic field generated using the superconductor in a superconductive state interacts with a second magnetic field generated from a magnet attached to the vehicle, and
   levitates relative to the second portion in response to a second lift force generated when the second magnetic field interacts with the conductor in an electrodynamics suspension system comprising the magnet and the conductor, wherein the vehicle levitates in response to a lift force and a experiences a resisting force resisting forward motion of the vehicle, the lift force and the resisting force resulting from a change in a magnetic field caused by motion of the magnet over the conductor.

18. The method of claim 17, wherein the first portion has a length sufficiently long for the vehicle to reach a speed, when entering the second portion from the first portion, such that the vehicle experiences a lift to drag ratio exceeding the maximal lift to drag ratio of the second portion.

19. A vehicle, comprising:
   a magnet attached to the vehicle, the magnet generating a magnetic field interacting with a rail including a first portion connected to a second portion, the first portion including a superconductor and the second portion including a conductor; and
   a computer system connected to the vehicle controlling a speed of the vehicle, wherein the vehicle:
   levitates relative to the first portion in response to a first lift force generated when a first magnetic field generated using the superconductor in a superconductive state interacts with a second magnetic field generated from a magnet attached to the vehicle,
   levitates relative to the second portion in response to a second lift force generated when the second magnetic field interacts with the conductor in an electrodynamic suspension system comprising the magnet and the conductor, wherein the vehicle levitates in response to a lift force and a experiences a resisting force resisting forward motion of the vehicle, the lift force and the resisting force resulting from a change in a magnetic field caused by motion of the magnet over the conductor, and
   has a speed entering the second portion from the first portion such that lift to drag ratio associated with the vehicle is at its maximum value for the second portion.

20. A passenger train 700b comprising the vehicle of claim 19.

* * * * *